United States Patent [19]

Shino et al.

[11] Patent Number: 5,279,979

[45] Date of Patent: Jan. 18, 1994

[54] SEMICONDUCTOR HAVING DIFFUSION REGION SEPARATED FROM THE GAP ELECTRODE AND WIRING LAYER

[75] Inventors: Katsuya Shino, Yokohama; Koushi Maeda, Kawasaki, both of Japan

[73] Assignee: Kabushiki Kaisha Toshiba, Kawasaki, Japan

[21] Appl. No.: 885,768

[22] Filed: May 20, 1992

[30] Foreign Application Priority Data

May 20, 1991 [JP]  Japan .................................. 3-114843

[51] Int. Cl.$^5$ ........................................ H01L 21/266
[52] U.S. Cl. ..................................... 437/40; 437/191;
148/DIG. 20
[58] Field of Search ................ 437/40, 186, 189, 190,
437/191, 193; 148/DIG. 20, 106

[56] References Cited

U.S. PATENT DOCUMENTS

| | | | |
|---|---|---|---|
| 4,658,496 | 4/1987 | Beinvogl et al. | 437/200 |
| 5,064,776 | 11/1991 | Roberts | 437/191 |
| 5,082,796 | 1/1992 | El-Diwany et al. | 437/162 |
| 5,162,259 | 10/1992 | Kolar et al. | 437/193 |

Primary Examiner—Tom Thomas
Assistant Examiner—C. Chaudhari
Attorney, Agent, or Firm—Foley & Lardner

[57] ABSTRACT

A method of manufacturing a semiconductor device includes the steps of: forming a gate electrode and a wiring layer on a silicon oxide film formed on the surface of a semiconductor substrate, by using conductive material; forming a diffusion region on the surface of the semiconductor substrate by implanting impurities into the semiconductor substrate at an area other than the gate electrode and the wiring layer; and forming a film for electrically interconnecting the diffusion region and the wiring layer, using conductive material.

2 Claims, 2 Drawing Sheets

SEMICONDUCTOR HAVING DIFFUSION REGION SEPARATED FROM THE GAP ELECTRODE AND WIRING LAYER

FIELD OF THE INVENTION

The present invention relates to a method of manufacturing semiconductor devices, particularly to the structure of a wiring layer.

BACKGROUND OF THE INVENTION

A conventional method of manufacturing semiconductor devices will be described with reference to FIG. 2, showing the cross sections of a semiconductor device at each manufacturing step. A field oxide film 202 is formed on an element isolation region of a p-type semiconductor substrate 201. A silicon oxide film 203 is formed on the entire surface of the device, and thereafter a first layer polysilicon film 204 is formed. This polysilicon film 204 is formed in order that the silicon oxide film 203 under a gate electrode (to be later formed) not to be contaminated by the resist. Resist is coated on the whole surface of the device, and patterned to form a resist film 230. The structure of the device at this stage is shown in FIG. 2(a).

The polysilicon film 204 and silicon oxide film 203 are etched and patterned using the resist film 230 as a mask, to form polysilicon films 204a and 204b and silicon oxide films 203a and 203b shown in FIG. 2(b). A second layer 206 of polysilicon film 206 is formed on the whole surface of the device, and impurities, such as phosphor ions (P+), are implanted to form an n-type diffusion region 205 at the area having the thinnest film thickness above the semiconductor substrate 201 and not having the silicon oxide film 203a on the surface thereof.

Resist is coated on the entire surface of the device to form a patterned resist film 211 (FIG. 2(c)). Using the resist film 211 as a mask, the polysilicon film 206, polysilicon films 204a and 204b, and silicon oxide films 203a and 203b are etched. Accordingly, as shown in FIG. 2(c), a gate electrode and a wiring layer are formed at the same time, the gate electrode being formed by the polysilicon films 204aa and 206a on the gate oxide film 203aa, and the wiring layer being formed by the polysilicon films 204b and 206b.

A silicon oxide film 220 is formed on the entire surface of the device, using a thermal oxidization method. Then, phosphor ions (P+) are implanted as a first-time implantation to form n-type diffusion regions and 222 forming source and drain regions. After forming side walls 223 and 224 on the sides of the gate electrode and wiring layer, phosphor ions (P+) are implanted as a second-time implantation to form n-type diffusion regions 225 and 226 having a high concentration as shown in FIG. 2(d). The polysilicon film 206b having no underlying silicon film 203b is used for connecting the wiring layer to the n-type diffusion regions 222 and 226 via the n-type diffusion region 205a, and is generally called a buried contact.

The conventional manufacturing method described above, however, has the following associated problems. While etching the polysilicon films 206, 204a and 204b, and silicon oxide films 203a and 203b to form the gate electrode and wiring layer, the surface of the semiconductor substrate 201 without the resist film 211 being covered, is etched to about 1000 angstroms, forming a trench 213 within the n-type diffusion region 205. This phenomenon may cause connection failure between the n-type diffusion region 205 and the n-type diffusion regions 222 and 226, crystal defects, or insufficient insulation because it is difficult to fill an interlayer film between the first and second wiring layers, in the space of the trench 213.

The above-described phenomenon results for the following reasons. First, at the etching step shown in FIG. 2(c), the total film thickness of the gate oxide film 203aa, and polysilicon films 204aa and 206a on the gate electrode is thinner than the film thickness of the polysilicon film 206b at the buried contact area. Second, the insulating silicon oxide film 203 under the buried contact area as an etching stopper has been removed. The n-type diffusion region 205 formed through diffusion of impurities via the polysilicon film 206b into the p-type substrate 201 is electrically connected to the MOSFET n-type diffusion regions 222 and 226 while they are formed, as shown in FIG. 2(d). However, if the size of the trench 213 is large, such electrical connection cannot be realized, resulting in circuit failure.

It is conceivable that the area from which the polysilicon film 206 is removed, is confined to only the area having the silicon oxide film 203a, so as not to form the trench 213. This approach does not provide electrical connection between the n-type diffusion regions 205 and 226 and 222 as shown in FIG. 2(e), also resulting in circuit failure.

In solving the above problems, it is also conceivable that the n-type diffusion region is made large by diffusing phosphor ions (P+) at a higher concentration at the step shown in FIG. 2(b) into the polysilicon film 204. In this case, however, the n-type diffusion region 205 may extend deeper under the field oxide film 202, lowering the element isolation breakdown voltage.

SUMMARY OF THE INVENTION

It is therefore an object of the present invention to provide a method of manufacturing semiconductor devices capable of reliably interconnecting wiring layers and diffusion regions, and preventing crystal defects and insufficient insulation.

The present invention provides a method of manufacturing a semiconductor device comprising the steps of: forming a gate electrode and a wiring layer on a silicon oxide film formed on the surface of a semiconductor substrate, by using conductive material; forming a diffusion region on the surface of the semiconductor substrate by implanting impurities into the semiconductor substrate at an area other than the gate electrode and the wiring layer; and forming a film for electrically interconnecting the diffusion region and the wiring layer, using conductive material.

After forming a gate electrode and a wiring layer, a diffusion region is formed at an area other than the gate electrode and wiring layer. Therefore, this diffusion region is integrally formed.

The method of manufacturing a semiconductor device according to the present invention may comprise: a first step of forming at an element isolation region a field oxide film on the surface of a semiconductor substrate of a first conductivity type, and forming a silicon oxide film on the whole surface of the semiconductor device; a second step of depositing polysilicon on the surface of the silicon oxide film to form a first polysilicon film and implanting impurities into said first polysilicon film; a third step of patterning the first polysilicon film using a photoetching method to form a gate electrode and a wiring layer; a fourth step of forming a silicon oxide film on the surfaces of the gate electrode and the wiring layer; a fifth step of implanting impurities of a second conductivity type to form diffusion regions of the second conductivity type at the areas other than the gate electrode and the wiring layer, to thereby form a source region, a drain region, and a wiring diffusion region, the wiring diffusion region being formed continuously between one of the source and drain regions and the field oxide film; a sixth step of selectively removing the silicon oxide film at the area where the wiring diffusion region is formed and at a partial area of the field oxide area adjacent to the first-mentioned area; a seventh step of depositing polysilicon on the whole surface of the semiconductor device to form a second polysilicon film and implanting impurities into said second polysilicon film and an eighth step of patterning the second polysilicon film using a photoetching method and selectively leaving the second polysilicon film at the area where the wiring diffusion region and the wiring layer are electrically connected.

After forming the gate electrode and wiring layer by patterning the first polysilicon layer, the source and drain regions and wiring diffusion region are formed. Since the wiring diffusion region and source and drain regions are formed at the same time, it is possible to eliminate defects on the substrate which might be caused by etching processes used for forming such regions at separate processes, reliably interconnecting the wiring diffusion region and the source or drain region. If a trench is formed in the wiring diffusion region, an interlayer insulating film is hard to be filled within the trench, resulting in insufficient insulation. However, such a problem can be avoided by the present invention. Furthermore, since the first polysilicon for the gate electrode and the second polysilicon film for the buried contact area are patterned at different processes, the distance between the gate electrode and the electrical connection area for he wiring diffusion region and wiring layer can be reduced, allowing further miniaturization.

With regard to implanting impurities into the first polysilicon film, impurities can be implanted at a higher concentration to sufficiently reduce the resistance value of the first polysilicon film without diffusing impurities under the field oxide film, because of the presence of the silicon oxide film under the first polysilicon film.

If at the fifth step, diffusion regions are formed at the areas other than the gate electrode and wiring layer by implanting impurities at a first-time implantation, and after forming side walls on the sides of the gate electrode and wiring layer, impurities are implanted at a second-time implantation, then the slope of impurity concentration becomes gentle, suppressing the electric field intensity at the interfaces between the drain-channel and the source-channel from becoming too high.

DESCRIPTION OF THE PREFERRED EMBODIMENTS

Figure 1:
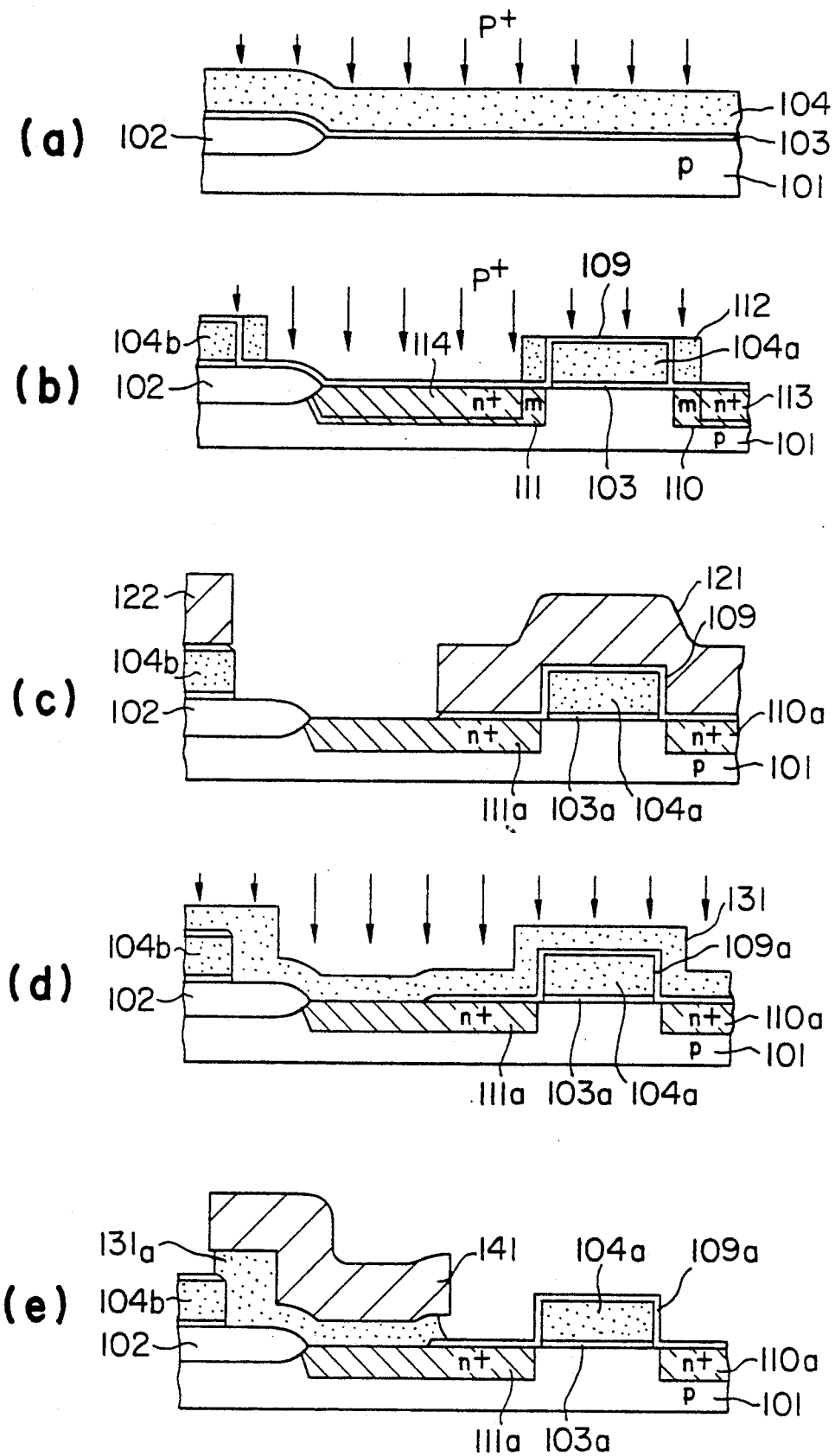
FIG. 1 is cross sections of a semiconductor device at each step of the method of manufacturing semiconductor devices according to an embodiment of the present invention.

A preferred embodiment of the present invention will be described with reference to FIG. 1 showing the cross sections of a semiconductor device at each of its manufacturing step. As shown in FIG. 1(a), a field oxide film 102 is formed on the surface of a p-type semiconductor substrate 101 at the element isolation region. A silicon oxide film 103 having a film thickness of 100 to 200 angstroms for example is formed on the whole surface of the device by means of a thermal oxidization method. A polysilicon film 104 having a film thickness of about 2000 angstroms is deposited on the whole surface of the device by means of a CVD method. Phosphor ions (P+) for example are implanted and diffused into the polysilicon film 104.

As shown in FIG. 1(b), the polysilicon film 104 and oxide film 103 are etched and patterned by means of a photoetching method, leaving the films 104 and 103 only at the areas where a gate electrode and wiring layer are formed. A silicon oxide film is formed on the whole surface of the device by means of a thermal oxidization method, and phosphor ions (P+) are implanted as a first-time implantation at a dose of $5-6 \times 10^{13}$ (1/cm$^2$) and at an acceleration voltage of 50 to 60 (keV), to form n-type diffusion regions 110 and 111. After depositing polysilicon, side walls 112 are formed on the sides of the wiring layer and gate electrode by means of anisotropic etching. Phosphor ions (P+) are implanted as a second-time implantation at a dose of $5-6 \times 10^{15}$ (1/cm$^2$) and at an acceleration voltage of 50 to 60 (keV) to form n+-type diffusion regions 113 and 114 having a higher concentration. In this manner, the diffusion region connected to a buried contact area of a polysilicon film later formed and the diffusion regions of a source or drain, are integrally formed as the n-type diffusion regions 111 and 114.

Resist is coated on the entire surface of the device, and patterned to leave it only at the area above the buried contact area, forming resist films 121 and 122 shown in FIG. 1(c). Using these resist films 121 and 122, the silicon oxide film 109 is etched.

After removing the resist films 121 and 122, polysilicon is deposited on the entire surface of the device by means of a CVD method to form a polysilicon film 131 having a film thickness of 500 to 1000 angstroms. Impurities such as phosphor ions (P+) are implanted and diffused into the polysilicon film 131 to lower its resistance.

Resist is coated on the entire surface of the device and patterned to be removed only at the area slightly larger than that of the buried contact area, forming a resist film 141. Using this resist film 141 as a mask, the polysilicon film 131 is etched leaving the polysilicon film 131a to form the buried contact such as shown in FIG. 1(e).

Figure 2:
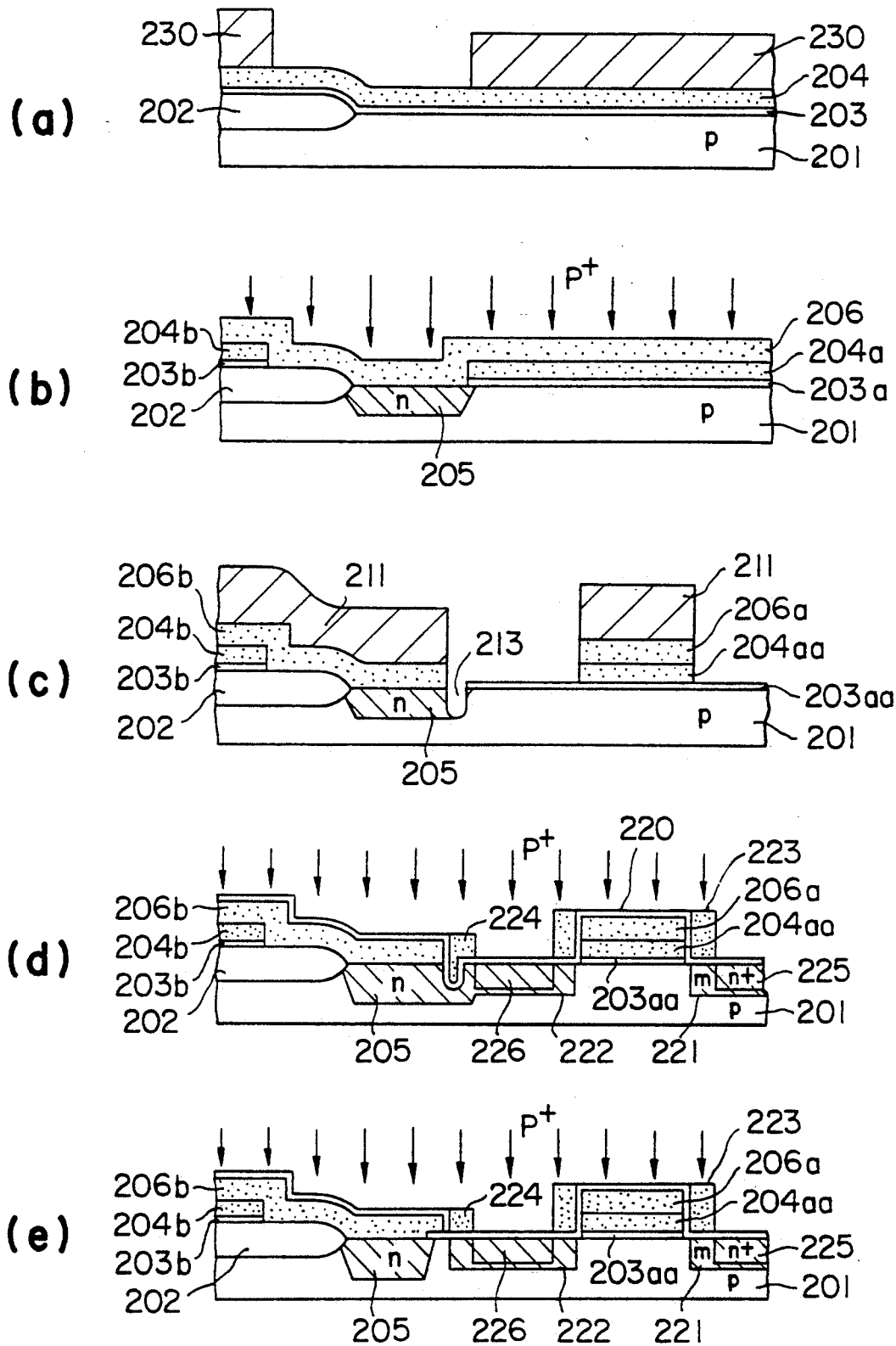
FIG. 2 is cross sections of a semiconductor device at each step of a conventional manufacturing method.

As described above, according to the embodiment, the polysilicon film 131a for the buried contact is formed after forming the polysilicon film 104a for the gate electrode and the n-type diffusion regions 110a and 111a for the source and drain regions. Furthermore, the diffusion regions for a source or drain and the diffusion region connected to the buried contact area, are integrally formed as the n-type diffusion region 111a. Therefore, the trench 213 (FIG. 2(c)) in the n-type diffusion region 205 formed by the conventional method is not formed, reliably interconnecting the wiring layer and the source or drain region. Since the trench 213 is not formed, crystal defects on the surface of the semiconductor substrate 101 can be suppressed from being generated, and an interlayer insulating film between the buried contact and the second wiring layer can be deposited reliably, preventing insufficient insulation.

Furthermore, the silicon oxide film 103 is present under the polysilicon film 104 at the time of diffusing phosphor ions (P+) into the polysilicon film 104 as shown in FIG. 1(a). Therefore, phosphor ions (P+) can be diffused into the polysilicon film 104 at a sufficiently high concentration, lowering the resistance of the wiring layer, without diffusing them into the semiconductor substrate. Phosphor ions (P+) are therefore prevented from being diffused under the field oxide film 104b, preventing the breakdown voltage from being lowered.

The embodiment described above is not intended to limit the scope of the present invention. For example, the conductivity type of the semiconductor substrate and diffusion regions may use the opposite type to the type described above.

What is claimed is:

1. A method of manufacturing a semiconductor device comprising:
    a first step of forming at an element isolation region a field oxide film on the surface of a semiconductor substrate of a first conductivity type, and forming a silicon oxide film on the surface of the semiconductor device;
    a second step of depositing polysilicon on the surface of said silicon oxide film to form a first polysilicon film and implanting impurities into said first polysilicon film;
    a third step of patterning said first polysilicon film using a photoetching method to form a gate electrode and a wiring layer;
    a fourth step of forming a silicon oxide film on the surfaces of said gate electrode and said wiring layer;
    a fifth step of implanting impurities of a second conductivity type to form diffusion regions of said second conductivity type at the areas other than said gate electrode and said wiring layer, to thereby form a source region, a drain region, and a wiring diffusion region, said wiring diffusion region being formed continuously between one of said source and drain regions and said field oxide film;
    a sixth step of selectively removing said silicon oxide film at the area where said wiring diffusion region is formed and at a partial area of said field oxide area adjacent to said wiring diffusion region;
    a seventh step of depositing polysilicon on the surface of the semiconductor device to form a second polysilicon film and implanting impurities into said second polysilicon film; and
    an eighth step of patterning said second polysilicon film using a photoetching method and selectively leaving said second polysilicon film at the area where said wiring diffusion region and said wiring layer are electrically connected.

2. A method of manufacturing a semiconductor device according to claim 1, wherein said fifth step includes the steps of:
    implanting impurities of said second conductivity type as a first-time implantation to form diffusion regions of said second conductivity type having a first impurity concentration at the areas other than said gate electrode and said wiring layer;
    depositing polysilicon on the surface of the semiconductor device, and forming side walls at the sides of said gate electrode and said wiring layer through anisotropic etching; and
    implanting impurities of said second conductivity type as a second-time implantation to form diffusion regions of said second conductivity type having an impurity concentration higher than said first impurity concentration at the areas other than said gate electrode, said wiring layer, and said side walls, to thereby form said source region, said drain region, and said wiring diffusion region, said wiring diffusion region being formed continuously between one of said source and drain regions and said field oxide film.

* * * * *